United States Patent
Hsu et al.

(10) Patent No.: US 7,804,148 B2
(45) Date of Patent: Sep. 28, 2010

(54) OPTO-THERMAL MASK INCLUDING ALIGNED THERMAL DISSIPATIVE LAYER, REFLECTIVE LAYER AND TRANSPARENT CAPPING LAYER

(75) Inventors: Louis L. Hsu, Fishkill, NY (US); Jack A. Mandelman, Flat Rock, NC (US); Chandrasekhar Narayan, San Jose, CA (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 11/355,799

(22) Filed: Feb. 16, 2006

(65) Prior Publication Data
US 2007/0187670 A1 Aug. 16, 2007

(51) Int. Cl.
*H01L 23/58* (2006.01)
*H01L 31/058* (2006.01)
*H01L 31/02* (2006.01)
*H01L 31/0232* (2006.01)
*H01L 31/024* (2006.01)
*H01L 21/033* (2006.01)
*H01L 21/00* (2006.01)

(52) U.S. Cl. .......................... 257/435; 257/48; 257/467; 257/431; 257/432; 257/629; 257/E31.11; 257/E31.127; 257/E31.131; 257/E21.035; 257/E21.036; 438/69; 438/71

(58) Field of Classification Search ..................... 257/1, 257/24, 192, 410, 411, 435, 184, 290, 433, 257/E29.324, 98, 695, 659, 471, 469, E21.035, 257/E21.036, 432, 48, 467, 431, 629, E31.11, 257/E31.127, E31.131; 438/550, 660, 661, 438/662, 530, 540, 795, 308, 902, 50, 52, 438/582, 142, 54, 55, 69, 72, 64, 71
See application file for complete search history.

(56) References Cited

U.S. PATENT DOCUMENTS

| | | | | |
|---|---|---|---|---|
| 3,721,289 | A | * 3/1973 | Seal ........................... | 165/80.2 |
| 5,043,251 | A | * 8/1991 | Sonnenschein et al. ...... | 430/297 |
| 5,493,153 | A | * 2/1996 | Arikawa et al. ............. | 257/796 |
| 5,824,597 | A | * 10/1998 | Hong .......................... | 438/625 |
| 5,904,575 | A | 5/1999 | Ishida et al. | |
| 6,008,101 | A | 12/1999 | Tanaka et al. | |
| 6,008,506 | A | * 12/1999 | Morikawa .................... | 257/85 |
| 6,049,114 | A | * 4/2000 | Maiti et al. ................. | 257/412 |
| 6,291,302 | B1 | 9/2001 | Yu | |

(Continued)

OTHER PUBLICATIONS

Zhgoon, S.A.; Revkov, A.M.; Barinov, A.E.; Zhang, Q.; Yoon, S.F.; Ahn, J.; Rusli, "DLC films for SAW devices and novel self-aligning fabrication process," Ultrasonics Symposium, 2000 IEEE , vol. 1, No., pp. 341-344 vol. 1, Oct. 2000.*

*Primary Examiner*—Phat X Cao
*Assistant Examiner*—Diana C Garrity
(74) *Attorney, Agent, or Firm*—Thomas A. Beck; Daniel P. Morris

(57) ABSTRACT

An opto-thermal annealing mask stack layer includes a thermal dissipative layer located over a substrate. A reflective layer is located upon the thermal dissipative layer. A transparent capping layer, that may have a thickness from about 10 to about 100 angstroms, is located upon the reflective layer. The opto-thermal annealing mask layer may be used as a gate electrode within a field effect device.

8 Claims, 6 Drawing Sheets

U.S. PATENT DOCUMENTS

| | | |
|---|---|---|
| 2001/0012702 A1 | 8/2001 | Kim |
| 2001/0044175 A1 | 11/2001 | Barrett et al. |
| 2003/0086046 A1* | 5/2003 | You .......................... 349/149 |
| 2003/0141506 A1* | 7/2003 | Sano et al. ................. 257/78 |
| 2004/0224447 A1 | 11/2004 | Adachi et al. |
| 2005/0089317 A1* | 4/2005 | Mizukawa et al. .......... 392/407 |
| 2005/0116229 A1 | 6/2005 | Yoshimoto |
| 2005/0242397 A1* | 11/2005 | Nagano et al. .............. 257/347 |
| 2005/0277030 A1* | 12/2005 | Yan .............................. 430/5 |

* cited by examiner

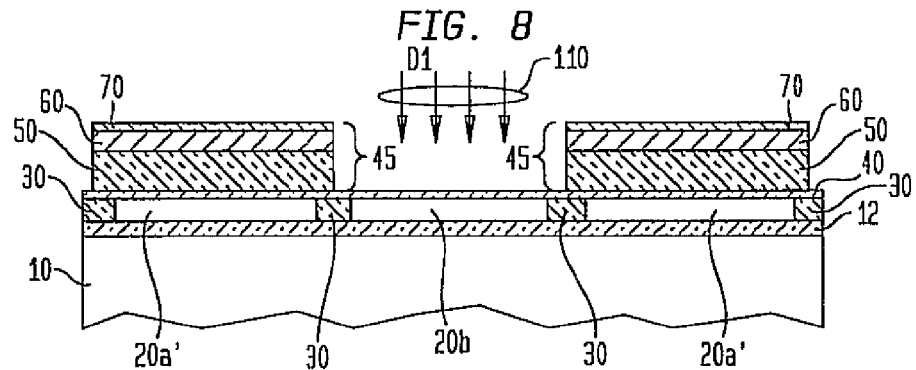
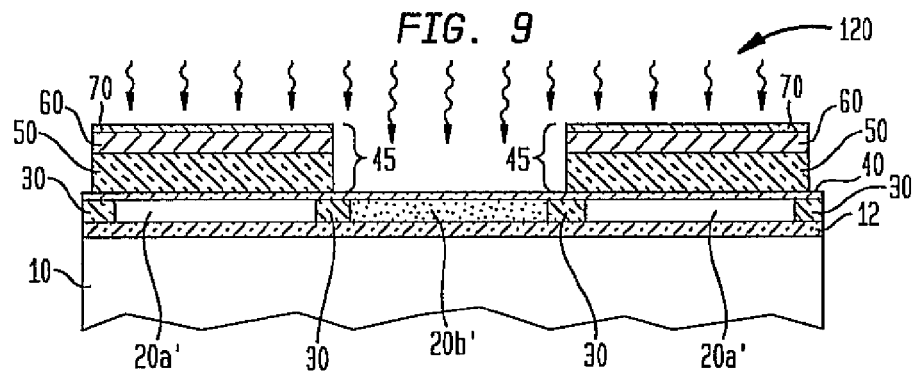
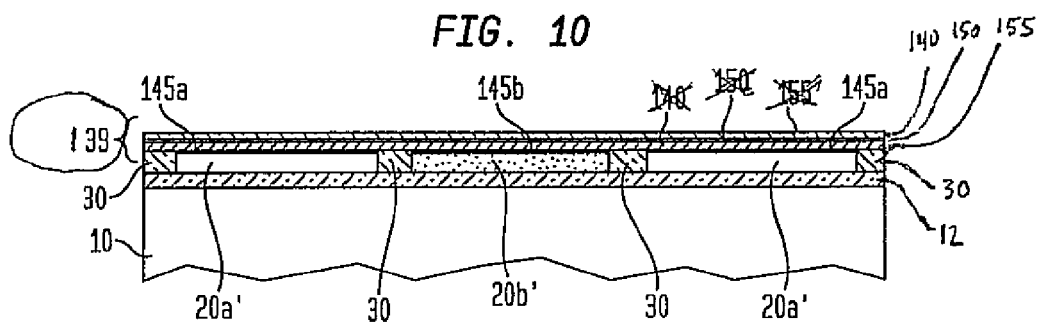
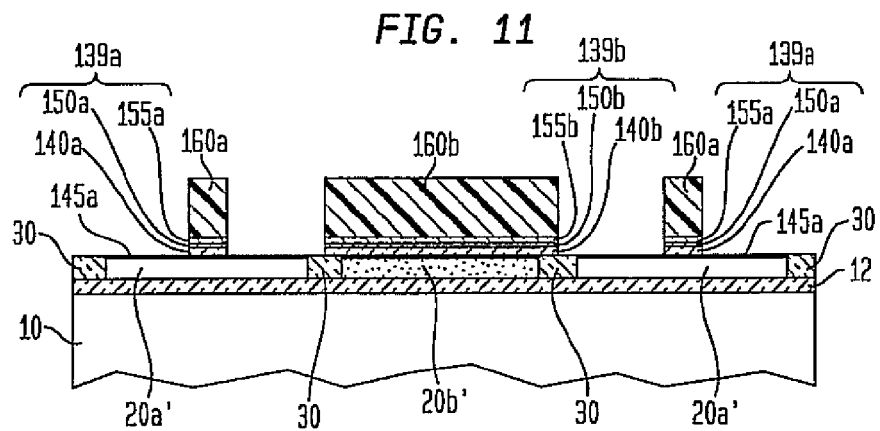

OPTO-THERMAL MASK INCLUDING ALIGNED THERMAL DISSIPATIVE LAYER, REFLECTIVE LAYER AND TRANSPARENT CAPPING LAYER

BACKGROUND

1. Field of the Invention

The invention relates generally to a method for fabricating a microelectronic structure, such as a semiconductor structure. More particularly, the invention relates to a laser annealing method for fabricating microelectronic structures, such as semiconductor structures.

2. Description of the Related Art

Common when fabricating microelectronic structures, and in particular when fabricating semiconductor structures, is the use of thermal annealing methods. Thermal annealing methods are often used in conjunction with other microelectronic fabrication methods. For example, thermal annealing methods are often used subsequent to, and in conjunction with, ion implantation methods for purposes of repairing ion implantation induced damage within a semiconductor substrate. Alternatively, thermal annealing methods are also used for forming, or subsequently annealing, metal silicide layers that, in turn, provide low contact resistance contact regions within semiconductor devices and semiconductor structures.

Conventional thermal annealing methods such as, for example, rapid thermal annealing methods and batch furnace annealing methods, typically lack a precision of thermal exposure (i.e., a thermal budget) that is generally required when a plurality of semiconductor device types is integrated onto a single semiconductor substrate. Such conventional thermal annealing methods also typically lack a possibility of spatial discrimination and control that is often also desirable when thermally annealing a plurality of semiconductor device types that is integrated onto a single semiconductor substrate. Thus, in order to provide for enhanced thermal annealing precision and enhanced thermal annealing spatial control, optically induced thermal annealing methods (i.e., opto-thermal methods such as, laser annealing methods) are often used for thermally annealing semiconductor substrates.

Although laser annealing methods are often essential within semiconductor structure fabrication, laser annealing methods are nonetheless also not without problems. As semiconductor structure dimensions continue to decrease and semiconductor device fabrication and integration complexity continues to increase, additional thermal annealing precision and spatial discrimination advances are needed for opto-thermal annealing methods.

Various laser induced annealing methods having enhanced capabilities are known in the semiconductor fabrication art.

For example, Tsukamoto, in U.S. Pat. No. 5,401,666, teaches a laser annealing method for selectively thermally annealing a gate electrode with respect to a source/drain region within a metal oxide semiconductor field effect transistor (MOSFET) device. This prior art method uses a laser reflectance control layer formed upon both the gate electrode and the source/drain region. The prior art laser reflectance control layer has a dimension optimized for reflection at the gate electrode and a different dimension optimized for absorbance at the source/drain region.

In addition, Offord et al., in U.S. Statutory Invention Registration H1637, teaches a laser annealing method for assisting in fabrication of bipolar transistors within silicon-on-sapphire (SOS) substrates. This prior art method uses an aluminum mask intended to reflect laser radiation from silicon layer regions within the SOS substrate where melting is not desired.

Further, Essaian et al., in U.S. Pat. No. 6,355,544, teaches a selective laser annealing method for incorporating a comparatively high dopant concentration (i.e., 1e18 to 1e21 dopant atoms per cubic centimeter) into a semiconductor substrate. This particular prior art method uses: (1) a doped spin-on-glass (SOG) layer as a dopant source layer contacting the semiconductor substrate; in conjunction with (2) a patterned anti-reflective coating (ARC) layer that assists in melting and interdiffusing specific portions of the SOG layer and the semiconductor substrate.

Dimensions of semiconductor devices and semiconductor structures are certain to continue to decrease. As a result, a need for both thermal annealing precision and spatial discrimination will continue to exist when laser annealing semiconductor substrates.

SUMMARY OF THE INVENTION

The invention provides several structures and a method that allow for enhanced thermal annealing precision and spatial discrimination when optically induced thermal (i.e., opto-thermal, typically laser) annealing a microelectronic structure such as, a semiconductor structure. Each of the inventive structures and method uses an opto-thermal annealing mask layer that comprises, in layered sequence: (1) a thermal dissipative layer located over a substrate; (2) a reflective layer located upon the thermal dissipative layer; and (3) a transparent capping layer located upon the reflective layer.

The first of the structures derives directly from the disclosure above. To that end, the first structure comprises a thermal dissipative layer located over a substrate. The first structure also comprises a reflective layer located upon the thermal dissipative layer. Finally, the first structure also comprises a transparent capping layer located upon the reflective layer.

Optionally, an optical interference layer may be included within the first structure. The optical interference layer is located laterally with respect to the thermal dissipative layer over the substrate.

The second structure comprises an opto-thermal annealing masked semiconductor substrate. In particular, the second structure comprises a semiconductor substrate including a plurality of separate lateral surface semiconductor regions, each of which has a separate thermal annealing budget. The second structure also includes an opto-thermal annealing mask stack layer located registered with respect to a second lateral surface semiconductor region having a second thermal annealing budget, and leaving uncovered a separate first lateral surface semiconductor region having a first thermal annealing budget greater than the second thermal annealing budget. Within the second structure, the opto-thermal annealing mask stack layer comprises: (1) a thermal dissipative layer located over the semiconductor substrate; (2) a reflective layer located aligned upon the thermal dissipative layer; and (3) a transparent capping layer located aligned upon the reflective layer.

The second structure may also include an opto-thermal annealing interference mask layer located registered with respect to a third lateral surface semiconductor region separate from the first lateral surface semiconductor region and the second lateral surface semiconductor region. The third lateral surface semiconductor region has a third thermal annealing budget between the first thermal annealing budget and the second thermal annealing budget.

A method, in accordance with the invention, is directed towards opto-thermally annealing a semiconductor substrate. The method includes forming an opto-thermal annealing mask stack layer over a second lateral surface semiconductor region of a semiconductor substrate, while leaving uncovered a first lateral surface semiconductor region of the semiconductor substrate separate from the second lateral surface semiconductor region. The opto-thermal annealing mask stack layer comprises an aligned tri-layer laminate that includes, in outward progression from the semiconductor substrate: (1) a thermal dissipative layer; (2) a reflective layer; and (3) a transparent capping layer. The method also includes opto-thermally annealing the masked semiconductor substrate, while using an opto-thermal radiation source.

The method may also include forming an opto-thermal annealing interference mask layer over a third lateral surface semiconductor region of the semiconductor substrate separate from the first lateral surface semiconductor region and the second lateral surface semiconductor region, prior to opto-thermally annealing the masked semiconductor substrate, while using the opto-thermal radiation source.

Finally, the invention provides a field effect transistor structure. The field effect transistor structure comprises a semiconductor substrate including a pair of source/drain regions that are separated by a channel region. The field effect transistor also comprises a gate electrode located over the channel region. Within the field effect transistor, the gate electrode comprises: (1) a thermal dissipative layer; (2) a reflective layer located upon the thermal dissipative layer; and (3) a transparent capping layer located upon the thermal dissipative layer.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein:

FIG. 4 to FIG. 19 show a series of schematic cross-sectional diagrams illustrating the results of progressive stages in fabricating a CMOS device in accordance with a more specific embodiment of the invention that comprises a second embodiment of the invention.

DESCRIPTION OF THE PREFERRED EMBODIMENTS

Figure 1:
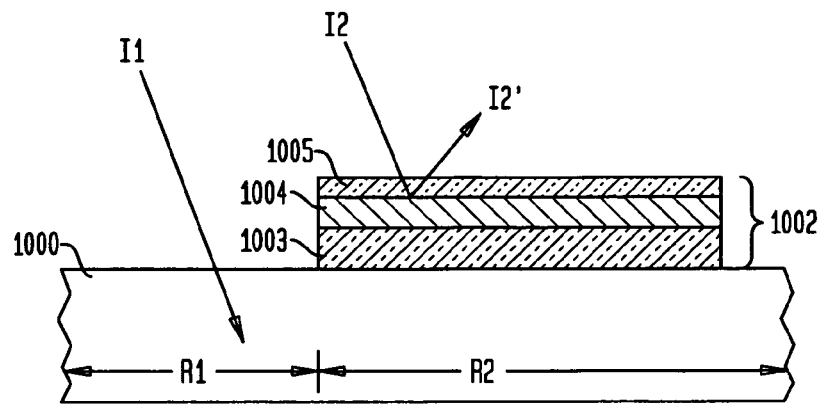
FIG. 1 to FIG. 3 show a series of schematic cross-sectional diagrams illustrating a general embodiment of the invention, that comprises a first embodiment of the invention.
Figure 2:
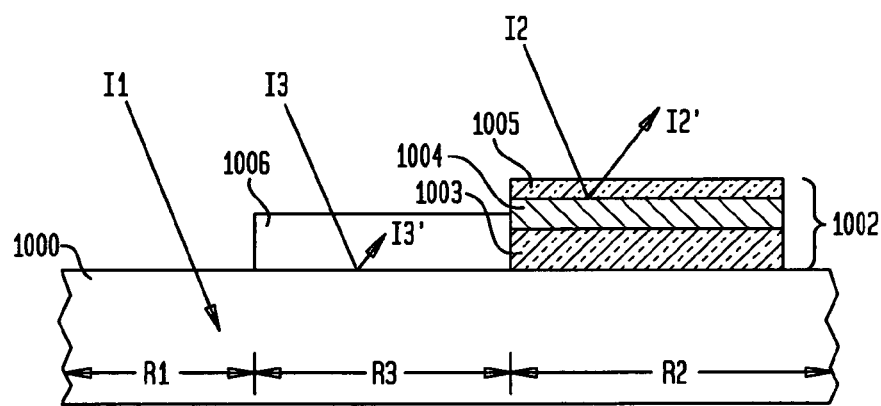
Figure 3:
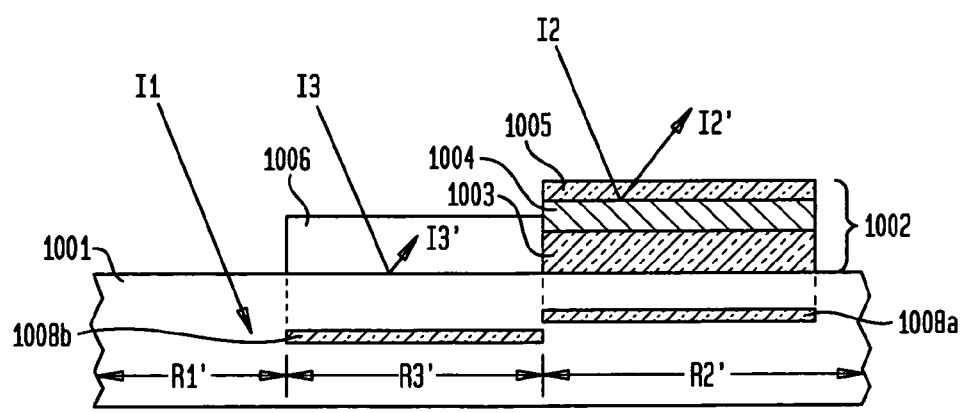

FIG. 1 to FIG. 3 show a series of schematic cross-sectional diagrams illustrating a general embodiment of the invention, that comprises a first embodiment of the invention.

FIG. 1 shows a substrate 1000 having a first region R1 and a second region R2. Located upon the second region R2, but not the first region R1, is an opto-thermal (i.e., laser) annealing mask stack layer 1002. The opto-thermal annealing mask stack layer 1002 comprises: (1) a thermal dissipative layer 1003 located over (and not necessarily upon) the substrate 1000; (2) a reflective layer 1004 located upon the thermal dissipative layer 1003; and (3) a transparent capping layer 1005 located upon the reflective layer 1004.

FIG. 1 also shows: (1) a first incident radiation beam I1 (i.e., a laser annealing beam) incident upon the first region R1 of the substrate 1000 and absorbed by the substrate 1000; and (2) an identical second incident radiation beam I2 incident upon the transparent capping layer 1005 over the second region R2 of the substrate 1000. The second incident radiation beam I2 is desirably completely reflected at the interface with the reflective layer 1004 to provide a reflected radiation beam I2'. The incident radiation beams I1 and I2 are intended as laser (typically excimer laser) radiation beams that are intended to opto-thermally anneal the first region R1 of the substrate 1000, but not the second region R2 of the substrate 1000.

The substrate 1000 may comprise any of several materials that are conventional in the microelectronic fabrication art, and in particular the semiconductor fabrication art. The materials may include, but are not limited to: conductor materials, semiconductor materials and/or dielectric materials. The invention is particularly appropriate to a substrate 1000 that comprises a semiconductor material, insofar as optimization of electrical properties within a semiconductor material is often effected incident to thermal annealing of the semiconductor material. As is illustrated within the context of comparison with a drawing figure that follows, while the substrate 1000 will typically comprise a bulk semiconductor substrate, the invention is not so limited. Rather the invention may also be practiced with respect to a semiconductor-on-insulator substrate.

The thermal dissipative layer 1003 comprises a thermal dissipative material. Non-limiting examples include thermal dissipative dielectric materials, thermal dissipative semiconductor materials and thermal dissipative conductor materials. Thermal dissipative dielectric materials and thermal dissipative semiconductor materials are not common, but nonetheless some are known, and they are often comprised of diamond like carbon materials. Due to enhanced thermal conductivity, thermal dissipative conductor materials are most common. Thermal dissipative conductor materials may include, but are not limited to: metals, metal alloys, certain metal nitrides and certain metal silicides. The thermal dissipative materials may be deposited using methods that are appropriate to their materials of composition, and are also conventional in the art. Appropriate methods include chemical vapor deposition methods, including atomic layer chemical vapor deposition methods, physical vapor deposition methods and plasma activated deposition methods. Typically, the thermal dissipative layer 1003 has a thickness from about 500 to about 1500 angstroms.

The reflective layer 1004 may analogously comprise appropriate reflective materials that are selected within the context of the wavelength of the incident radiation beam 12. From a practical perspective, reflective conductor materials that comprise metals and metal alloys are again most common. Typically, the reflective conductor material will comprise a non-refractive conductor metal material, such as an aluminum conductor material or a copper conductor material. However, the invention is not so limited. The reflective material may also be deposited using methods that are appropriate to its composition, and also conventional in the microelectronic fabrication art. Typical methods include plating methods, chemical vapor deposition methods and physical vapor deposition methods (such as physical vapor deposition sputtering methods). Typically, the reflective layer 1004 comprises a non-refractive aluminum or aluminum alloy conductor metal material that has, a thickness from about 500 to about 1000 angstroms. Typically, the reflective layer 1004 is deposited using a physical vapor deposition method, such as a sputtering method. Other deposition methods, including evaporative deposition methods, may alternatively be used.

From a practical perspective, the transparent capping layer 1005 typically comprises a dielectric material since neither semiconductor materials nor conductor materials are generally transparent, although there are exceptions (e.g., conductive indium-tin oxide materials that may be transparent and may be used for the transparent capping layer 1005). Within the context of the invention, the transparent capping layer 1005 typically comprises a transparent dielectric material that has a thickness from about 10 to about 100 angstroms. Thus, the transparent capping layer 1005 is not intended to have anti-reflective properties that would otherwise compromise the reflective properties of the reflective layer 1004. Typically, the transparent capping layer 1005 comprises a silicon oxide transparent capping material that has a thickness from about 10 to about 100 angstroms. Alternative transparent capping materials, such as, but not limited to: nitrides and oxynitrides, may also be used. The silicon oxide transparent capping material may be deposited using any of several methods. Non-limiting examples include chemical vapor deposition methods and physical vapor deposition methods.

FIG. 2 shows an additional general embodiment of the invention where the opto-thermal annealing mask stack layer 1002 is also used.

The additional general embodiment is analogous to the first general embodiment that is illustrated in FIG. 1 insofar as both the first general embodiment and the additional general embodiment have a first region R1 of a substrate 1000 and a second region R2 of the substrate 1000, but the additional general embodiment also includes a third region R3 of the substrate 1000.

Located upon the third region R3 lateral from the thermal dissipative layer 1003 is an opto-thermal annealing interference mask layer 1006 that is intended to provide an intermediate level of optically induced thermal annealing control to the third region R3 of the substrate 1000 in comparison with either the second region R2 of the substrate 1000 or the first region R1 of the substrate 1000. As is illustrated in FIG. 2, the first region R1 is typically intended as having a complete, or a nearly complete, absorption of an incident radiation beam I1. The second region R2 is intended as having a complete, or a nearly complete, reflection of an incident radiation beam I2 to provide a reflected radiation beam I2'. The third region R3 is intended as having an intermediate level that comprises both partial absorption of an incident radiation beam I3 and partial reflection of the incident radiation beam I3 to provide a reflected radiation beam I3'. Within the third region R3, reflection may occur at the interface of the opto-thermal annealing interference mask layer 1006 and the substrate 1000. The additional general embodiment is not, however, limited to reflection at only that interface.

In light of the foregoing disclosure, relative effectiveness of the tunable opto-thermal annealing interference mask layer 1006 with respect to reflectance and absorbance is predicated upon a thickness of the tunable opto-thermal annealing interference mask layer 1006 in comparison with a wavelength of the incident radiation beam I3. When a thickness of the tunable opto-thermal annealing interference mask layer 1006 is about ¼ the wavelength of the incident radiation beam I3, absorption of the incident radiation beam I3 into the substrate 1000 is maximized. When a thickness of the tunable opto-thermal annealing interference mask layer 1006 is about ½ the wavelength of the incident radiation beam I3, reflectance of the incident radiation beam I3 with respect to the substrate 1000 is maximized.

FIG. 3 shows a schematic cross-sectional diagram of a microelectronic structure related to the microelectronic structure of FIG. 2, but wherein the substrate 1000 (that may comprise a bulk semiconductor substrate) within FIG. 2 is more specifically illustrated as a hybrid orientation technology substrate 1001.

The hybrid orientation technology substrate 1001 is intended to comprise a semiconductor substrate that has three separate regions R1', R2' and R3' that encompass multiple crystallographic orientations. The first region R1' is intended as a bulk semiconductor region. Each of the second region R2' and the third region R3' is intended as a semiconductor-on-insulator region. Each of the semiconductor-on-insulator regions R2' and R3' comprises (in vertical progression): (1) a semiconductor substrate; (2) a buried dielectric layer 1008a or 1008b located above the semiconductor substrate; and (3) a surface semiconductor layer located above the buried dielectric layer 1008a or 1008b. Within each of the semiconductor-on-insulator regions R2' and R3', the buried dielectric layer 1008a or 1008b may comprise the same or different dielectric materials, with the same or different thicknesses. However, the buried dielectric layer 1008a is spaced less deeply within the hybrid orientation technology substrate 1001 than the buried dielectric layer 1008b. Typical spacings are in a range from about 200 to about 2000 angstroms. Thus, a surface semiconductor layer thickness within the second region R2' is less than a surface semiconductor layer thickness within the third region R3'.

As a summary with respect to the structure illustrated in FIG. 3: (1) absorption of an incident radiation beam I1 is at a maximum in the first region R1' that comprises a bulk semiconductor region; (2) absorption of an incident radiation beam I2 is at a minimum in the second region R2' that comprises a semiconductor-on-insulator substrate region having a comparatively thin silicon surface layer; and (3) absorption of an incident radiation beam I3 is at an intermediate level in the third region R3' that comprises a semiconductor-on-insulator substrate region having a comparatively thick semiconductor surface layer.

The first embodiment within the context of FIG. 1 to FIG. 3 thus illustrates the beneficial use of an opto-thermal annealing mask stack layer 1002, optionally in conjunction with an opto-thermal annealing interference mask layer 1006, for purposes of differentially opto-thermally annealing specific selected portions of a substrate 1000 (or alternatively a hybrid orientation technology substrate 1001).

FIG. 4 to FIG. 19 show a series of schematic cross-sectional diagrams illustrating the results of forming within a semiconductor-on-insulator substrate a CMOS structure in accordance with a more specific embodiment of the invention that comprises a second embodiment of the invention. The CMOS structure is formed within the semiconductor-on-insulator substrate while using several process steps that use an opto-thermal annealing mask stack layer analogous to the opto-thermal annealing mask stack layer 1002 whose schematic cross-sectional diagram is illustrated in FIG. 1 to FIG. 3. Also included within the second embodiment is use of an opto-thermal annealing interference mask layer analogous to the opto-thermal annealing interference mask layer 1006 illustrated in FIG. 2 and FIG. 3.

Figure 4:
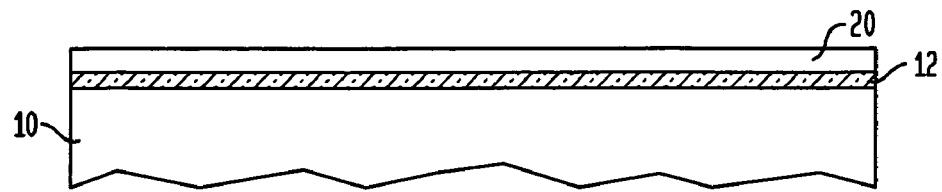

FIG. 4 shows a semiconductor substrate 10. A buried dielectric layer 12 is located upon the semiconductor substrate 10. A surface semiconductor layer 20 is located upon the buried dielectric layer 12. The aggregate of the semiconductor substrate 10, the buried dielectric layer 12 and the surface semiconductor layer 20 comprises a semiconductor-on-insulator substrate.

The semiconductor substrate 10 may comprise any of several semiconductor materials. Non-limiting examples include silicon, germanium, silicon-germanium alloy, silicon carbide and silicon-germanium carbide alloy semiconductor materials. Also included are compound semiconductor materials, of which gallium arsenide, indium arsenide and indium phosphide are non-limiting examples. Typically, the semiconductor substrate 10 comprises a silicon or silicon germanium alloy semiconductor material that has a thickness from about 1 to about 3 mils.

The buried dielectric layer 12 typically comprises an oxide, nitride or oxynitride dielectric material. Typically, the oxide, nitride or oxynitride dielectric material also comprises silicon, or silicon and germanium. Neither the embodiment, nor the invention, is limited to oxides, nitrides and oxynitrides of silicon, or silicon and germanium. Rather oxides, nitrides and oxynitrides of other elements may also be used for the buried dielectric layer 12. Typically, the buried dielectric layer 12 comprises a silicon oxide or silicon-germanium oxide material that has a thickness from about 200 to about 1000 angstroms.

The surface semiconductor layer 20 may comprise any of the semiconductor materials from which the semiconductor substrate 10 is comprised. The surface semiconductor layer 20 and the semiconductor substrate 10 may comprise the same or different semiconductor materials with respect to chemical composition, dopant polarity, dopant composition and crystallographic orientation. Typically the surface semiconductor layer 20 and the semiconductor substrate 10 have the same crystallographic orientation and the same semiconductor material composition, but not necessarily the same dopant concentrations.

The semiconductor-on-insulator substrate that is illustrated in FIG. 4 may be fabricated using any of several methods. Non-limiting examples include layer transfer methods, layer laminating methods and separation by implantation of oxygen (SIMOX) methods.

Figure 5:
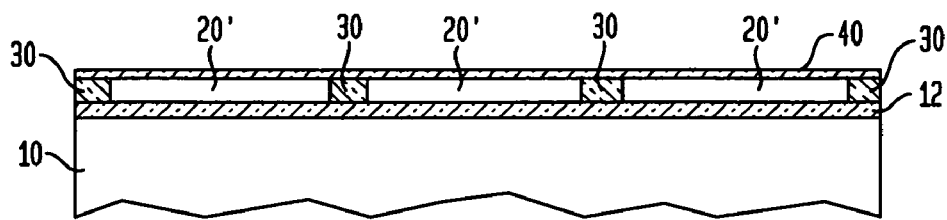

FIG. 5 first shows a series of patterned surface semiconductor layers 20' located upon the buried dielectric layer 12. The series of patterned surface semiconductor layers 20' is separated by a series of isolation regions 30 also located upon the buried dielectric layer 12. FIG. 5 finally shows a sacrificial dielectric layer 40 located upon the series of patterned surface semiconductor layers 20' and the series of isolation regions 30.

The series of patterned surface semiconductor layers 20' is patterned from the surface semiconductor layer 20 that is illustrated in FIG. 4. Patterning is effected using photolithographic and etch methods and materials that are otherwise generally conventional in the semiconductor fabrication art. The etch materials may include, but are not limited to: wet chemical materials, dry plasma materials and aggregate materials thereof. Anisotropic plasma etch methods and materials are generally preferred insofar as they provide essentially straight sidewalls to the series of patterned surface semiconductor layers 20'. Under certain circumstances, wet chemical etch methods and materials are not precluded. Typically, each of the series of patterned surface semiconductor layers 20' has a linewidth from about 0.1 to about 1.0 microns.

The series of isolation regions 30 is typically formed using a blanket isolation material layer deposition and subsequent planarization method. The blanket isolation material layer typically comprises a dielectric material. Typical dielectric materials include oxides, nitrides and oxynitrides (or laminates thereof) of silicon and/or germanium, although oxides, nitrides and oxynitrides of other elements are not excluded. Planarization may be effected using conventional planarization methods. Non-limiting examples of conventional planarizing methods include mechanical planarizing methods and chemical mechanical polish methods. Chemical mechanical polishing methods are common.

The sacrificial dielectric layer 40 also comprises a dielectric material. The dielectric material may be selected from the same group of dielectric materials from which the series of isolation regions 30 may be comprised. Typically, the sacrificial dielectric layer 40 comprises a different dielectric material in comparison with the series of isolation regions 30, or alternatively nominally the same dielectric material, but formed using a different method that provides the sacrificial dielectric layer 40 with a differentiable etch selectivity with respect to the series of isolation regions 30. Typically, the sacrificial dielectric layer 40 comprises a less dense silicon oxide material in comparison with the series of isolation regions 30. Typically, the sacrificial dielectric layer 40 has a thickness from about 20 to about 100 angstroms.

Figure 6:
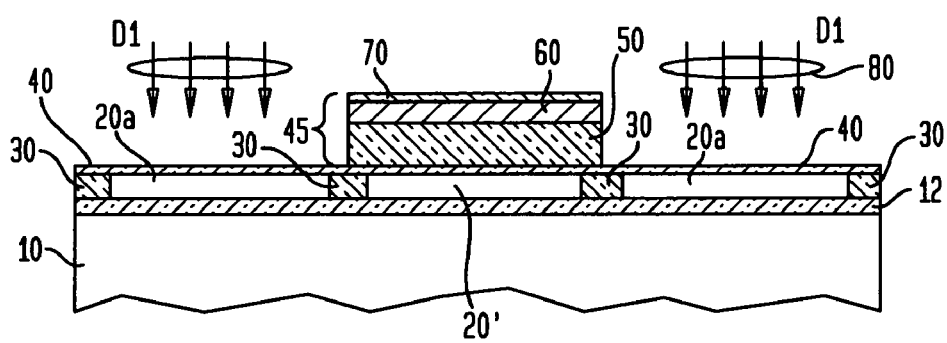

FIG. 6 first shows an opto-thermal annealing mask stack layer 45 located over a central of the three patterned surface semiconductor layers 20'. The opto-thermal annealing mask stack layer 45 may: (1) comprise materials; (2) have dimensions; and (3) be formed using methods, analogous, equivalent of identical to the materials, thickness and methods used in connection with the opto-thermal annealing mask stack layer 1002 that is illustrated in FIG. 1 to FIG. 3. Similarly with the opto-thermal annealing mask stack layer 1002 illustrated in FIG. 1 to FIG. 3, the opto-thermal annealing mask stack layer 45 comprises a thermal dissipative layer 50. A reflective layer 60 is located upon the thermal dissipative layer 50. Finally, a transparent capping layer 70 is located upon the reflective layer 60.

Within the second embodiment, the thermal dissipative layer 50 comprises a thermally dissipative material such as, but not limited to: a thermally dissipative diamond like carbon material or a thermally dissipative refractory metal material, either having a thickness from about 500 to about 1500 angstroms. The diamond like carbon material may be deposited using a chemical vapor deposition method. Other deposition methods are not precluded. The refractory metal material is typically deposited using a chemical vapor deposition method or a physical vapor deposition method. Other methods are also not precluded for the refractory metal material. Preferred refractory metal materials include titanium, tungsten, tantalum, as well as nitrides thereof and silicides thereof. The foregoing selections do not limit the invention. Typically, the reflective layer 60 comprises a reflective non-refractory metal material, such as, but not limited to: an aluminum metal material or a copper metal material. Typically, the reflective layer 60 has a thickness from about 500 to about 1000 angstroms. Typically, the transparent capping layer 70 comprises a transparent oxide material, such as, but not limited to: a transparent silicon oxide material. Typically, the transparent capping layer 70 has a thickness from about 10 to about 100 angstroms.

FIG. 6 also shows a dose of first dopant ions 80 implanted into the outer lying pair of patterned surface semiconductor layers 20', to thus form a pair of doped semiconductor surface layers 20a. The dose of first dopant ions 80 is of sufficient dose and energy to typically provide a dopant concentration from about 1e12 to about 1e14 dopant atoms per cubic centimeter within each of the pair of doped surface semiconductor layers 20a. The dose of first dopant ions 80 has an arbitrarily selected first conductivity type D1.

Figure 7:
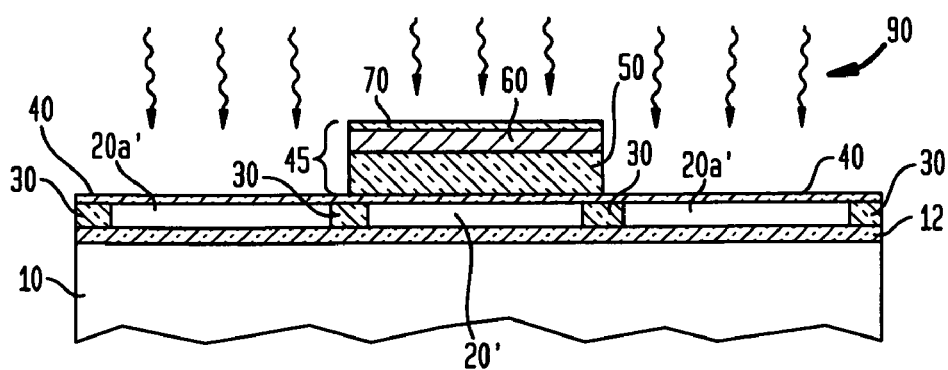

FIG. 7 shows the results of opto-thermally annealing the pair of doped surface semiconductor layers 20a to provide a corresponding pair of opto-thermally annealed doped surface semiconductor layers 20a' while using a first opto-thermal treatment 90. Incident to the foregoing opto-thermal annealing, the patterned surface semiconductor layer 20' that is located beneath the opto-thermal annealing mask stack layer 45 is substantially unaffected by the first opto-thermal treatment 90 in comparison with the pair of opto-thermally annealed doped surface semiconductor layers 20a'.

The first opto-thermal treatment 90 preferably uses an excimer laser. Other opto-thermal radiation sources having an appropriate wavelength and intensity are not precluded. Excimer lasers are available in several wavelengths, including, but not limited to: 193 nm (ArF), 249 nm (KrF) and 398 nm (XeCl). The first opto-thermal treatment 90 preferably uses an excimer laser of an appropriate wavelength, intensity and dose so that each of the pair of doped surface semiconductor layers 20a is thermally annealed at a temperature from about 800° C. to about 1200° C. for a time period from about 1 to about 10 hours.

FIG. 8 first shows the results of stripping the opto-thermal annealing mask stack layer 45 from over the remaining patterned surface semiconductor layer 20' that is illustrated in FIG. 7. The opto-thermal annealing mask stack layer 45 may be stripped using methods and materials that are conventional in the semiconductor fabrication art. Included are wet chemical etching methods and materials, dry plasma etching methods and materials and aggregate etching methods and materials thereof. Under circumstances of appropriate materials compositions, all layer combinations within the opto-thermal annealing mask stack layer 45 may be stripped using a plasma etch method that uses a fluorine containing etchant gas composition. Other etch methods and materials may also be used.

FIG. 8 shows an additional pair of opto-thermal annealing mask stack layers 45; one each located over each of the pair of opto-thermally annealed doped surface semiconductor layers 20a'. The additional pair of opto-thermal annealing mask stack layers 45 may comprise materials, have dimensions and be formed using methods analogous, equivalent or identical to the materials, dimensions and methods used in conjunction with the opto-thermal annealing mask stack layer 45 that is illustrated in FIG. 6 to FIG. 7.

FIG. 8 finally shows a dose of second dopant ions 110 implanted into the remaining patterned surface semiconductor layer 20' to form therefrom a doped surface semiconductor layer 20b. The dose of second dopant ions 110 has a conductivity type D2 that is different from the conductivity type D1 of the dose of first dopant ions 80. Again, the ion implantation uses the pair of opto-thermal annealing mask stack layers 45 as an ion implantation mask. The dose of second dopant ions 110 is also provided at a dose and an energy that provides the doped surface semiconductor layer 20b with a dopant concentration from about 1e12 to about 1e14 dopant atoms per cubic centimeter.

FIG. 9 shows an opto-thermally annealed doped surface semiconductor layer 20b' that results from opto-thermally annealing the doped semiconductor surface layer 20b that is illustrated in FIG. 8 with a second opto-thermal treatment 120. The second opto-thermal treatment 120 is provided using opto-thermal annealing methods analogous, equivalent or identical to the opto-thermal annealing methods used for opto-thermally annealing the pair of doped surface semiconductor layers 20a that are illustrated in FIG. 6 to form the pair of opto-thermally annealed doped surface semiconductor layers 20a' that is illustrated in FIG. 7.

FIG. 10 first illustrates the results of stripping the pair of opto-thermal annealing mask stack layers 45 that is illustrated in FIG. 9. The pair of opto-thermal annealing mask stack layers 45 may be stripped using methods and materials analogous, equivalent or identical to the methods and materials that are used for stripping the opto-thermal annealing mask stack layer 45 that is illustrated in FIG. 7 to provide, in part, the semiconductor structure that is illustrated in FIG. 8.

FIG. 10 also illustrates the results of stripping the sacrificial dielectric layer 40 that is illustrated in FIG. 5 to FIG. 9. The sacrificial dielectric layer 40 may be stripped using any of several methods and materials. Non-limiting examples include wet chemical methods and materials, dry plasma methods and materials and aggregate methods and materials thereof.

FIG. 10 further shows a pair of gate dielectric layers 145a and a single gate dielectric layer 145b located upon corresponding exposed surfaces of the pair of opto-thermally annealed doped surface semiconductor layers 20a' and the opto-thermally annealed doped surface semiconductor layer 20b'. The series of gate dielectric layers 145a and 145b may comprise generally conventional gate dielectric materials such as silicon oxides, silicon nitrides and silicon oxynitrides that have a dielectric constant from about 4 to about 20 measured in vacuum. Alternatively, the series of gate dielectric layers 145a and 145b may comprise a generally higher dielectric constant dielectric material having a dielectric constant from about 20 up to at least about 100. The higher dielectric constant dielectric materials may include, but are not limited to: hafnium oxides, hafnium silicates, titanium oxides, barium-strontium-titanates (BSTs) and lead-zirconate-titanates (PZTs). Typically each of the series of gate dielectric layers 145a and 145b comprises a thermal silicon oxide material that has a thickness from about 20 to about 70 angstroms.

FIG. 10 finally shows a blanket opto-thermal annealing mask stack layer 139 located upon the exposed portions of the series of gate dielectric layers 145a and 145b and the isolation regions 30. The blanket opto-thermal annealing mask stack layer 139 comprises a blanket thermal dissipative layer 140. A blanket reflective layer 150 is located upon the blanket thermal dissipative layer 140. A blanket transparent capping layer 155 is located upon the blanket reflective layer 150.

The blanket opto-thermal annealing mask stack layer 139 may comprise materials, have thickness dimensions and be formed using methods analogous, equivalent or identical to the materials, thickness dimensions and methods used for forming the opto-thermal annealing mask stack layers 45 that are illustrated in FIG. 9. However, the blanket opto-thermal annealing mask stack layer 139 preferably uses a thermal dissipative layer 140 that comprises a refractory metal. Preferred refractory metals include titanium, tungsten, tantalum, as well as nitrides thereof and silicides thereof. The foregoing selections do not limit the invention.

FIG. 11 first shows a pair of patterned photoresist layers 160a, and a single patterned photoresist layer 160b, that were initially also located upon the blanket opto-thermal annealing mask stack layer 139 that is illustrated in FIG. 10. The pair of patterned photoresist layers 160a subsequently serves as a pair of etch mask layers when forming a pair of gate electrode stacks 139a (comprising patterned thermal dissipative layers 140a, patterned reflective layers 150a and patterned transparent capping layers 155a) from the blanket opto-thermal annealing mask stack layer 139. The patterned photoresist layer 160b serves as an etch mask when forming a patterned opto-thermal annealing mask stack layer 139b (comprising patterned thermal dissipative layer 140b, patterned reflective layer 150b and patterned transparent capping layer 155b) from the blanket opto-thermal annealing mask stack layer 139. The blanket opto-thermal annealing mask stack layer 139 may be patterned to form the pair of gate electrode stacks 139a and the patterned opto-thermal annealing mask stack layer 139b using methods that are conventional in the microelectronic fabrication art. Anisotropic etch methods, such as plasma etch methods, are generally typical. Alternative methods may also be used.

The pair of patterned photoresist layers 160a and the single patterned photoresist layer 160b may comprise any of several photoresist materials that are conventional in the semiconductor fabrication art. Included are positive photoresist materials, negative photoresist materials and hybrid photoresist materials. Typically, each of the pair of patterned photoresist layers 160a and the single patterned photoresist layer 160b has a thickness from about 2000 to about 10000 angstroms.

Figure 12:
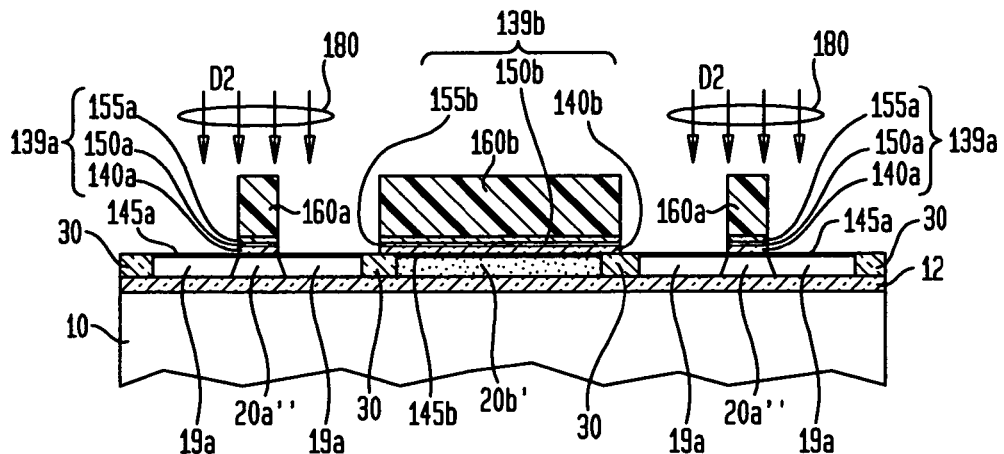

FIG. 12 shows the results of ion implanting the pair of opto-thermally annealed doped surface semiconductor layers 20a' to form a series of source/drain regions 19a and a pair of channel regions 20a'' adjoining thereto, and not further ion implanted. The ion implantation is effected using a dose of third dopant ions 180. The dose of third dopant ions 180 has the conductivity type D2, and it is typically provided at a dose and energy that provides a dopant concentration from about 1e18 to about 1e22 dopant atoms per cubic centimeter when forming the series of source/drain regions 19a and the pair of channel regions 20a''.

Figure 13:
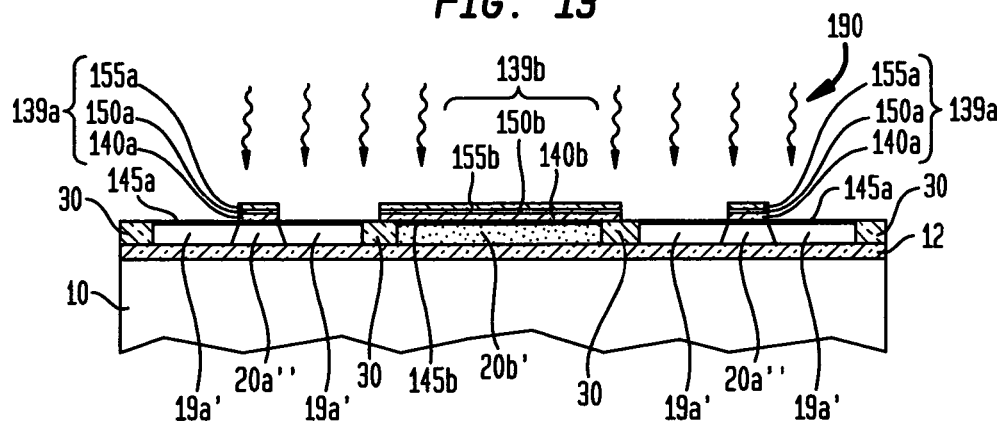

FIG. 13 first shows the results of stripping the pair of patterned photoresist layers 160a and the single patterned photoresist layer 160b from the corresponding pair of gate electrode stacks 139a and the patterned opto-thermal annealing mask stack layer 139b. The series of patterned photoresist layers 160a and 160b may be stripped using methods and materials that are conventional in the semiconductor fabrication art. The methods and materials may include, but are not limited to wet chemical methods and materials, dry plasma methods and materials and aggregate methods and materials thereof.

FIG. 13 finally shows the results of opto-thermally annealing the series of source/drain regions 19a to form a series of opto-thermally annealed source/drain regions 19a' while using a third opto-thermal treatment 190. The third opto-thermal treatment 190 is otherwise analogous or equivalent to the second opto-thermal treatment 120 that is illustrated in FIG. 9 or the first opto-thermal treatment 90 that is illustrated in FIG. 7. The series of opto-thermally annealed source/drain regions 19a' is opto-thermally annealed while the pair of gate electrode stacks 139a and the patterned opto-thermal annealing mask stack layer 139b are in place to provide opto-thermal reflection for underlying doped semiconductor regions. As a result, the semiconductor structure illustrated in FIG. 13 is opto-thermally annealed within the context of a more precise thermal budget and with greater spatial control.

Figure 14:
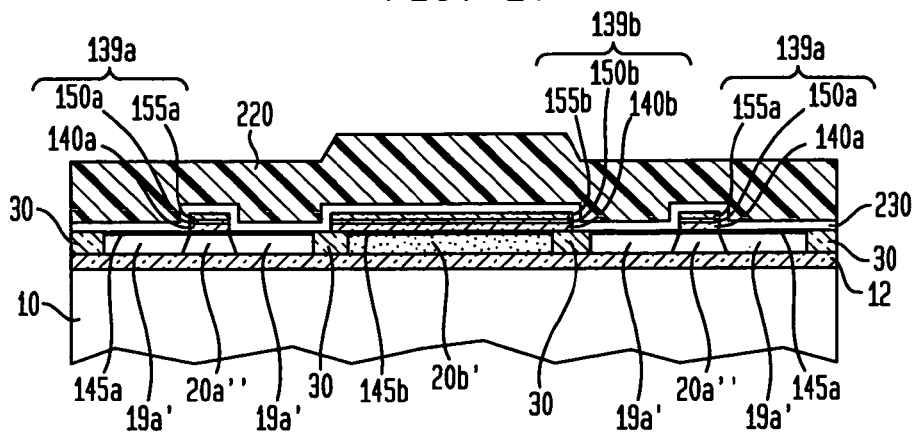

FIG. 14 first shows a blanket opto-thermal annealing interference mask layer 230 located covering the semiconductor structure of FIG. 13. FIG. 14 also shows a blanket second photoresist layer 220 located upon the blanket opto-thermal annealing interference mask layer 230.

The blanket opto-thermal annealing interference mask layer 230 comprises materials, has a thickness and may be formed using methods analogous, equivalent or identical to the materials, thickness and methods used for forming the opto-thermal annealing interference mask layer 1006 illustrated in FIG. 2 and FIG. 3. Typically, the blanket opto-thermal annealing interference mask layer 230 comprises a silicon oxide material having a thickness tuned for optimal opto-thermal reflection. Other materials may be used.

The blanket second photoresist layer 220 otherwise uses materials, thicknesses and methods analogous, equivalent or identical to the materials, thicknesses and methods used for forming the series of patterned photoresist layers 160a and 160b shown in FIG. 1 and FIG. 12.

Figure 15:
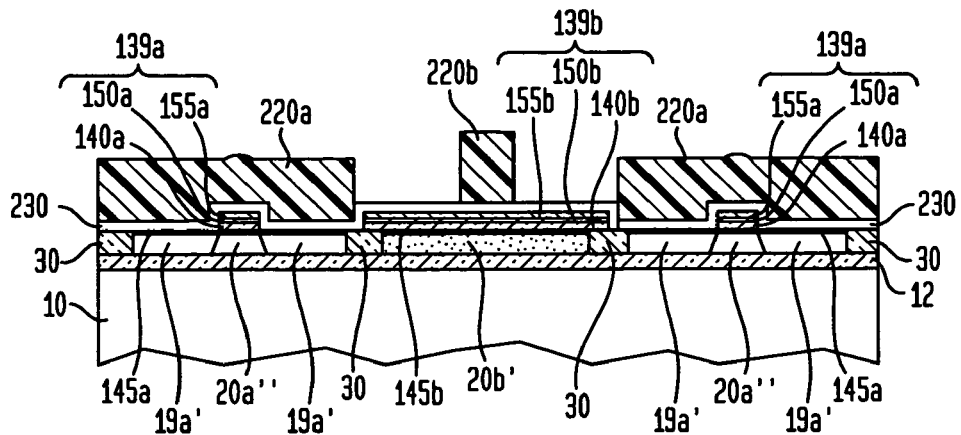

FIG. 15 shows the results of patterning the blanket second photoresist layer 220 to form a pair of patterned second photoresist layers 220a and a single central patterned second photoresist layer 220b. The blanket second photoresist layer 220 may be patterned to form the pair of patterned second photoresist layers 220a and the central patterned second photoresist layer 220b using photolithographic methods and materials that are conventional in the semiconductor fabrication art. The methods and materials are discussed in further detail above within the context of the series of patterned photoresist layers 160a and 160b illustrated in FIG. 11 and FIG. 12.

Figure 16:
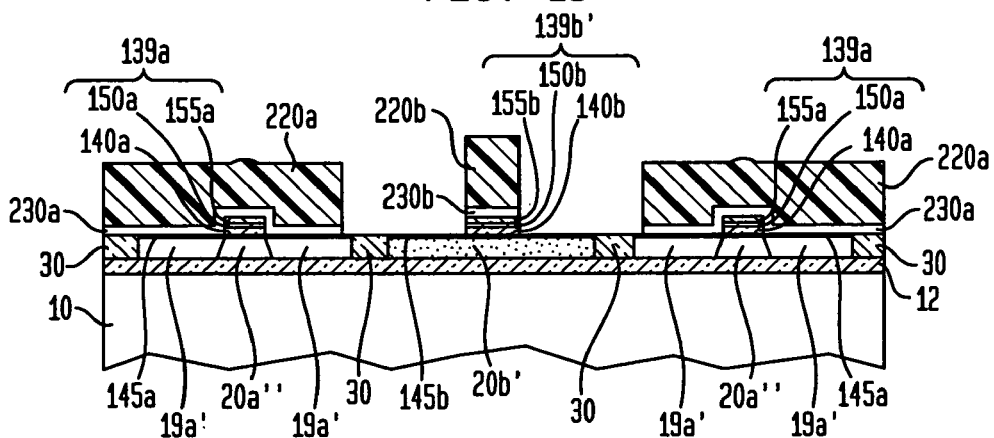

FIG. 16 shows the results of further patterning of the blanket opto-thermal annealing interference mask layer 230 to form a pair of patterned opto-thermal annealing interference mask layers 230a and a single patterned opto-thermal annealing interference mask layer 230b. FIG. 16 also shows the results of further patterning of the patterned opto-thermal annealing mask stack layer 139b to form a gate electrode stack 139b'. The foregoing patterning is effected using the pair of patterned photoresist layers 220a and the single patterned photoresist layer 220b as a mask. The patterning is further effected while using etch methods that are conventional in the semiconductor fabrication art. Included but not limiting are wet chemical and dry plasma etch methods. Dry plasma methods are typically preferred.

Figure 17:
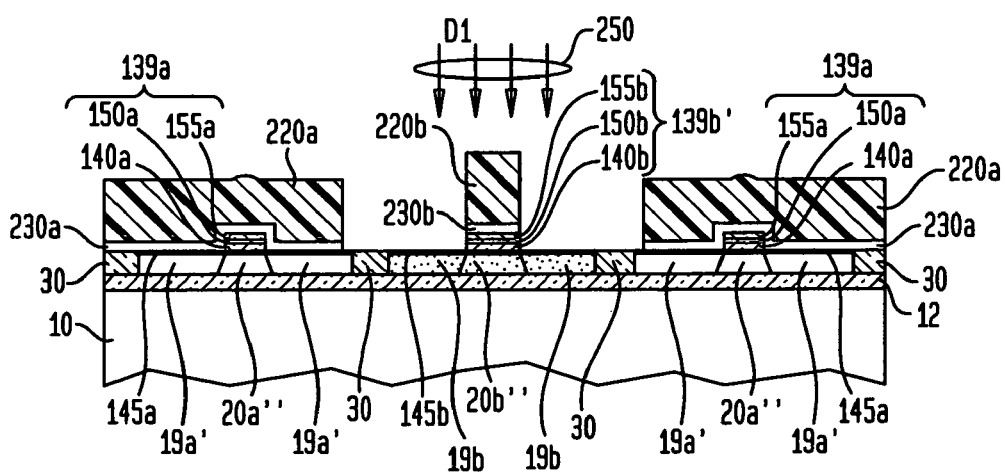

FIG. 17 shows the results of implanting the thermally annealed doped semiconductor surface layer 20b' while using the patterned photoresist layer 220b, the patterned opto-thermal annealing interference mask layer 230b and the gate electrode stack 139b' as a mask. The ion implanting is effected using a dose of fourth dopant ions 250. The dose of fourth dopant ions 250 has the first conductivity type D1. As a result of ion implanting the dose of fourth dopant ions 250 a pair of source/drain regions 19b and a channel 20b'' is formed from the opto-thermally annealed doped surface semiconductor layer 20b'. The dose of fourth dopant ions 250 is intended to provide a dopant concentration from about 1e18 to about 1e22 dopant atoms per cubic centimeter within the pair of source/drain regions 19b.

Figure 18:
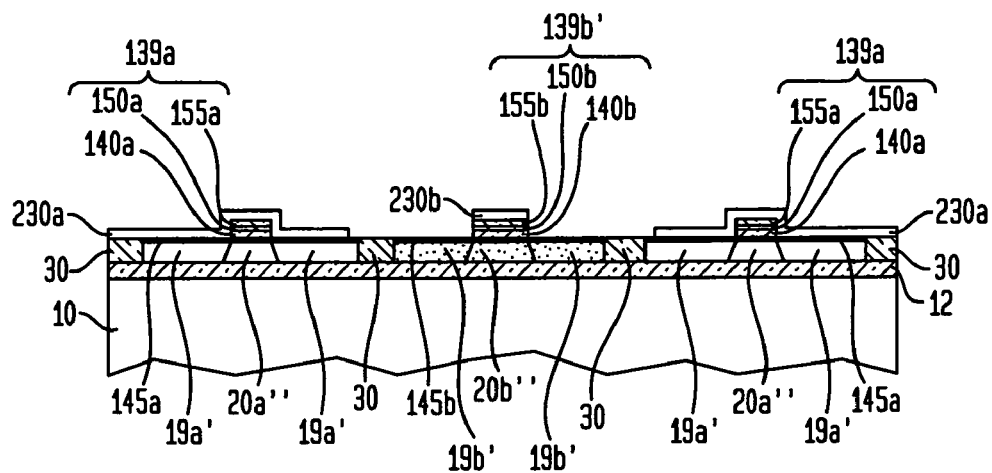

FIG. 18 first shows the results of stripping the series of patterned second photoresist layers 220a and 220b from the semiconductor structure of FIG. 17. The series of patterned second photoresist layers 220a and 220b may be stripped using methods and materials that are disclosed above within the context of the series of patterned photoresist layers 160a and 160b.

Figure 19:
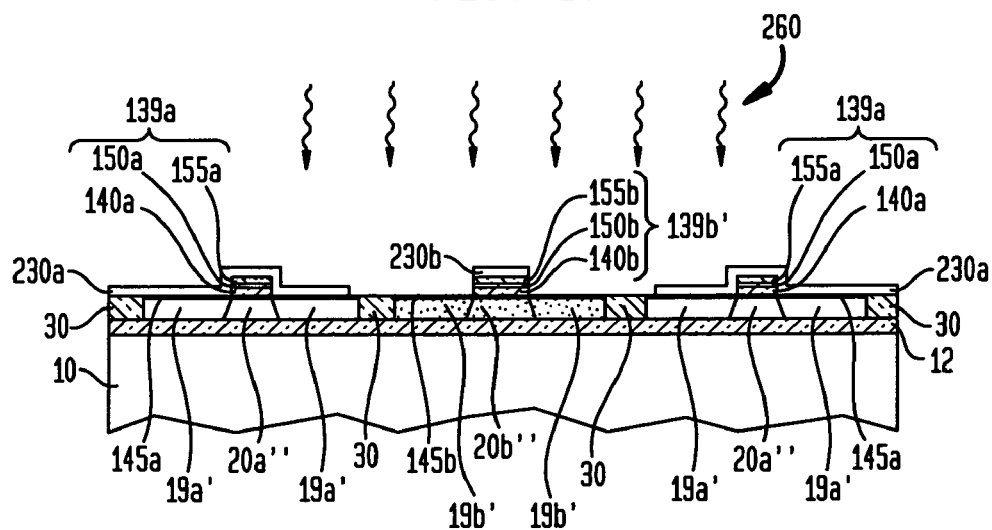

FIG. 19 finally shows the results of opto-thermally annealing the pair of source/drain regions 19b that is illustrated in FIG. 18 to provide a: pair of annealed source/drain regions 19b'. The pair of source/drain regions 19b is annealed to provide the pair of annealed source/drain regions 19b' while using a fourth opto-thermal treatment 260. The fourth opto-thermal treatment 260 is otherwise analogous, equivalent or identical to the first opto-thermal treatment 90, the second opto-thermal treatment 120 or the third opto-thermal treatment 190.

When thermally annealing the pair of source/drain regions 19b to form the pair of thermally annealed source/drain regions 19b' while using the fourth opto-thermal treatment 260, each of the pair of peripheral field effect transistor devices is masked from opto-thermal exposure by covering with the opto-thermal annealing interference mask layers 230a. Similarly, the channel region 20b'' is masked from opto-thermal exposure by presence of: (1) the opto-thermal annealing interference mask layer 230*b*; and (2) the gate electrode stack 139*b'*.

Thus, due to the presence of opto-thermal annealing mask layers (i.e., both opto-thermal annealing mask stack layers and opto-thermal annealing interference mask layers) a CMOS structure is provided within the context of the preferred embodiments of the invention with both enhanced thermal annealing precision and enhanced spatial discrimination.

The preferred embodiments of the invention are illustrative of the invention rather than limiting of the invention. Revisions and modifications may be made to methods, materials, structures and dimensions in accordance with the preferred embodiments of the invention while still providing an embodiment in accordance with the invention, further in accordance with the accompanying claims.

What is claimed is:

1. A structure comprising:
a microelectronic structure having a substrate and a plurality of layers, each layer having an upper and a lower surface and four sidewall surfaces, each said upper and lower surface defining a flat area,
a thermal dissipative layer having a thickness of from about 500 to 1500 Å, selected from the group consisting of a thermally dissipative diamond-like carbon material, titanium, tungsten, tantalum, and nitrides and silicides and alloys thereof, the lower surface area of said thermal dissipative layer located over and being in spatially continuous contact with all or a portion of an upper surface area of said substrate, wherein said substrate is selected from the group consisting of a bulk semiconductor substrate, a semiconductor-on-insulator substrate, and a hybrid semiconductor substrate comprising at least one bulk semiconductor region and at least one semiconductor-on-insulator region;
a reflective layer having a thickness of from about 500 to 1000 Å, and being a non-refractory metal material selected from the group consisting of aluminum metal material and copper metal material, the lower surface area of said reflective layer being located over and in spatially continuous contact with the upper surface area of said thermal dissipative layer and said reflective layer is located upon the entirety of said area of said thermal dissipative layer; and
a dielectric transparent capping layer selected from the group consisting of indium-tin oxide, silicon oxide, silicon nitride and silicon oxynitride having a thickness of from about 10 to 100 Å, said dielectric transparent capping layer located directly upon said reflective layer, such that the lower surface area of said dielectric transparent capping layer is located over and in spatially continuous spatial contact with the upper surface area of said reflective layer wherein a given sidewall of each of said thermal dissipative layer, said reflective layer and said transparent capping layer is aligned with respect to one another.

2. The structure of claim 1 wherein the capping layer has a thickness from about 10 to about 100 angstroms.

3. The structure of claim 1 wherein the substrate comprises a bulk semiconductor substrate.

4. The structure of claim 1 wherein the substrate comprises a semiconductor-on-insulator substrate.

5. The structure of claim 1 wherein the substrate comprises a hybrid semiconductor substrate comprising at least one bulk semiconductor region and at least one semiconductor-on-insulator region.

6. The structure of claim 1 wherein: the thermal dissipative layer comprises a refractory metal; and the reflective layer comprises a non-refractory metal.

7. The structure of claim 1 wherein: the thermal dissipative layer comprises a thermal dissipative diamond like carbon material; and the reflective layer is a non-refractory metal material selected from the consisting of aluminum metal material and copper metal material.

8. A structure comprising:
a microelectronic structure having a substrate and plurality of layers, each layer having an upper and a lower surface and four sidewall surfaces, each said upper and lower surface defining a flat spatial area,
a lower surface of a thermal dissipative layer located over an in spatially continuous contact with a portion of the upper surface of said substrate;
the lower surface of a reflective layer located upon the entirety of and in spatially continuous contact with the upper surface of said thermal dissipative layer;
a dielectric transparent capping layer having a lower surface located directly upon and in spatially continuous contact with the reflective layer, wherein a given sidewall of each of said thermal dissipative layer, said reflective layer and said transparent capping layer is aligned with respect to one another to provide a stack located over a first portion of said upper surface of said substrate;
and an optical interference layer having a lower incident radiation reflectance than the reflective layer located laterally with respect to the stack over a second portion of said upper surface of said substrate that does not include said first portion of the substrate.

\* \* \* \* \*